United States Patent
Lin et al.

(10) Patent No.: US 7,203,129 B2
(45) Date of Patent: Apr. 10, 2007

(54) SEGMENTED MRAM MEMORY ARRAY

(75) Inventors: Wen-Chin Lin, Hsin-Chu (TW);
Danny D. Tang, Saratoga, CA (US);
Li-Shyue Lai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 199 days.

(21) Appl. No.: 10/780,171

(22) Filed: Feb. 16, 2004

(65) Prior Publication Data

US 2005/0180203 A1 Aug. 18, 2005

(51) Int. Cl.
*G11C 8/00* (2006.01)
(52) U.S. Cl. .................. 365/243; 365/171; 365/175
(58) Field of Classification Search ................ 365/148, 365/242, 243, 130, 170, 171, 172, 230.03, 365/158, 173, 175
See application file for complete search history.

(56) References Cited

U.S. PATENT DOCUMENTS

| | | | |
|---|---|---|---|
| 5,640,343 A | 6/1997 | Gallagher et al. | |
| 6,097,625 A | 8/2000 | Scheuerlein | |
| 6,272,041 B1 | 8/2001 | Naji | |
| 6,317,375 B1 | 11/2001 | Perner | |
| 6,356,477 B1 | 3/2002 | Tran | |
| 6,490,217 B1* | 12/2002 | DeBrosse et al. | 365/225.5 |
| 6,885,577 B2* | 4/2005 | Tang et al. | 365/158 |
| 6,891,755 B2* | 5/2005 | Silvagni et al. | 365/185.13 |
| 6,937,509 B2* | 8/2005 | Perner et al. | 365/171 |
| 6,940,749 B2* | 9/2005 | Tsang | 365/171 |
| 2002/0034117 A1* | 3/2002 | Okazawa | 365/230.03 |
| 2003/0117840 A1* | 6/2003 | Sharma et al. | 365/173 |
| 2005/0243598 A1* | 11/2005 | Lin et al. | 365/158 |

FOREIGN PATENT DOCUMENTS

JP 2003208785 * 7/2003

OTHER PUBLICATIONS

English machine translation for JP2003208785 retrieved from PAJ.*

* cited by examiner

*Primary Examiner*—Anh Phung
*Assistant Examiner*—Alexander Sofocleous
(74) *Attorney, Agent, or Firm*—Haynes and Boone, LLP

(57) ABSTRACT

In one example, an MRAM memory array includes a plurality of word lines, a plurality of bit lines crossing the word lines, and a plurality of first and second diodes, and magnetic tunnel junction memories. Each first diode includes a cathode, and an anode coupled to each bit line. Each second diode includes an anode, and a cathode coupled to each word line. The magnetic tunnel junction memories include a pinned layer, a free layer, and a non-magnetic layer. The non-magnetic layer is located between the pinned layer and the free layer. Each diode is positioned at crossing points of the bit lines and the word lines and connected between the first diode at the corresponding crossing bit line and the second diode at the corresponding crossing word line.

12 Claims, 10 Drawing Sheets

| 3X2 array | Row=3, Column=2 | | | | | |
|---|---|---|---|---|---|---|
| Target | The others | Resistor 52B | Resistor 52C | Resistor 52D | Sneak Impedance | Total R |
| 1x | 1x | 0.5x | 1x | 0.5x | 2.0x | 0.6667x |
| 1x | 1.4x | 0.7x | 1.4x | 0.7x | 2.8x | 0.7368x |
| 1.4x | 1x | 0.5x | 1x | 0.5x | 2.0x | 0.8235x |
| 1.4x | 1.4x | 0.7x | 1.4x | 0.7x | 2.8x | 0.9333x |

FIG. 7

| 3X2 array | Row=3, Column=3 | | | | | |
|---|---|---|---|---|---|---|
| Target | The others | Resistor 52B | Resistor 52C | Resistor 52D | Sneak Impedance | Total R |
| 1x | 1x | 0.5x | 0.5x | 0.25x | 1.250x | 0.5556x |
| 1x | 1.4x | 0.7x | 0.7x | 0.35x | 1.750x | 0.6364x |
| 1.4x | 1x | 0.5x | 0.5x | 0.25x | 1.250x | 0.6604x |
| 1.4x | 1.4x | 0.7x | 0.7x | 0.35x | 1.750x | 0.7778x |

FIG. 8

SEGMENTED MRAM MEMORY ARRAY

BACKGROUND

The present disclosure relates generally to Magnetoresistive Random Access Memories (MRAMs) and, more particularly, to segmented magnetic tunnel junction (MTJ) MRAM arrays.

MRAM is a non-volatile memory that may be used for long term data storage. A typical MRAM device includes an array of memory cells. Word lines extend along rows of the memory cells, and bit lines extend along columns of the memory cells. Each MTJ cell in the array is located at a cross point of a word line and a bit line.

Each MTJ cell generally includes a non-magnetic conductor forming a lower electrical contact, a pinned magnetic layer, a tunnel barrier layer positioned on the pinned layer, and a free magnetic layer positioned on the tunnel barrier layer with an upper contact on the free magnetic layer.

The pinned layer of magnetic material has a magnetic vector that is always pointed in the same direction. The magnetic vector of the free layer is free, but constrained by the physical size of the layer, to point in either of two directions. An MTJ cell is used by connecting it in a circuit such that current flows vertically through the cell from one of the layers to the other. The MTJ cell can be electrically represented as a resistor and the size of the resistance depends upon the orientation of the magnetic vectors. The MTJ cell generally has a relatively high resistance when the magnetic vectors are misaligned (e.g., point in opposite directions) and a relatively low resistance when the magnetic vectors are aligned. That is, an MTJ cell stores a bit of information as the relative orientation of the magnetizations of the fixed and variable magnetic materials. In other words, the magnetization of each memory cell at any given time assumes one of two stable orientations. These two stable orientations, referred to as "parallel" and "anti-parallel" magnetic orientation, represent logic values of "0" and "1," for example. The resistance of an MTJ cell varies depending upon whether it stores a "0" or a "1" value. The relative orientation of the magnetizations of a selected memory cell (and, therefore, the logic state of the memory cell) may be read by sensing the resistance value of the selected memory cell.

However, current memory architectures are generally insufficient for the sensing techniques used to read such memory cells. For example, it may be difficult in existing architectures to adequately compensate for sneak currents that may render memory reads inaccurate or unreliable, or reading from a memory cell may require too many steps.

Accordingly, what is needed is an improved MRAM memory array that may be used to resolve the above-described issues.

BRIEF DESCRIPTION OF THE DRAWINGS

Aspects of the present disclosure are best understood from the following detailed description when read with the accompanying figures. It is noted that various features may not be drawn to scale. In fact, the dimensions of the various features may be arbitrarily increased or reduced for clarity of discussion.

FIG. 7 is a table illustrating exemplary impedance calculations for a cross-point circuit of a 2×3 memory array.

FIG. 8 is a table illustrating exemplary impedance calculations for a cross-point circuit of a 3×3 memory array.

WRITTEN DESCRIPTION

Figure 1A:
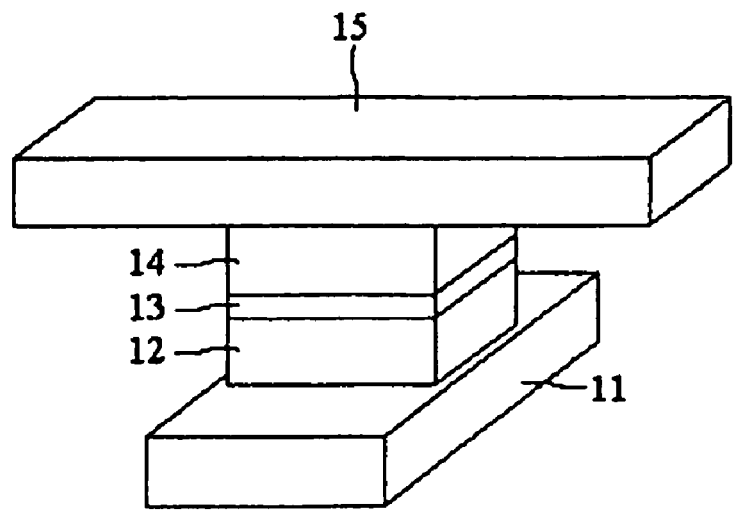
FIG. 1A is a schematic perspective view illustrating of an exemplary MTJ cell of an MRAM device.

The present disclosure relates generally to Magnetoresistive Random Access Memories (MRAMs) and, more particularly, to segmented magnetic tunnel junction (MTJ) MRAM arrays. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1B:
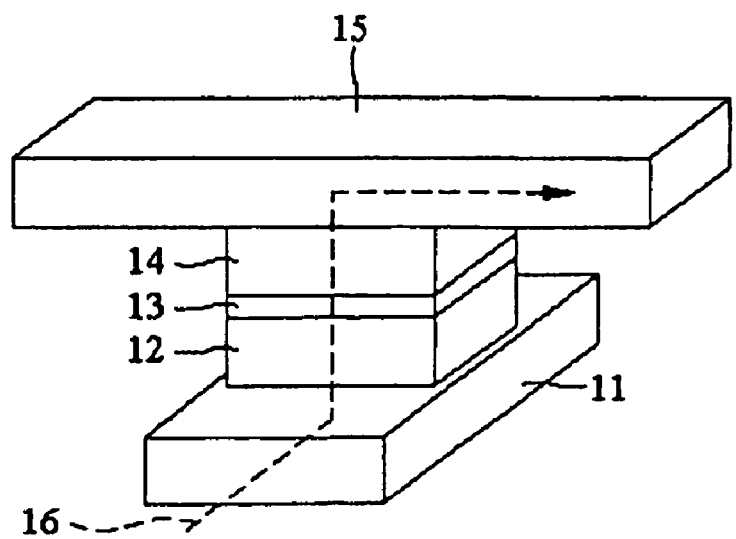
FIG. 1B is a schematic perspective view illustrating an exemplary read operation for the MTJ cell of FIG. 1A.
Figure 1C:
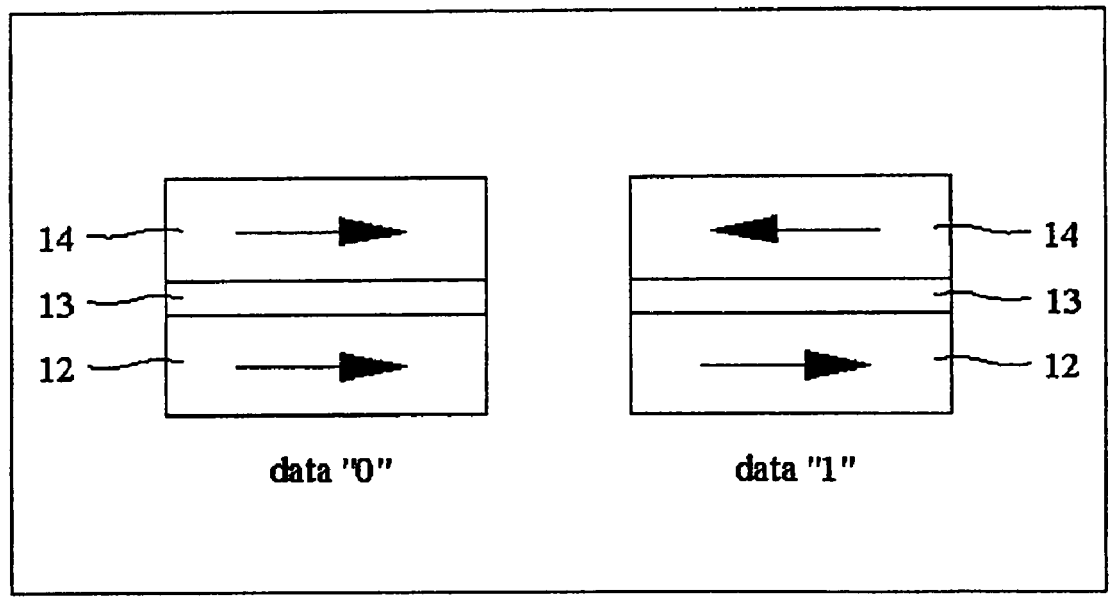
FIG. 1C is a cross-sectional view illustrating magnetization states that may vary depending on data stored in the MTJ cell of FIG. 1A.

Referring to FIGS. 1A–1C, a single exemplary MTJ memory cell of an MRAM device is illustrated. The single memory cell comprises a first metal layer 11, a pinned layer 12, a non-magnetic layer 13, a free layer 14, and a second metal layer 15. The MTJ cell portion of the single memory cell comprises the pinned layer 12, the non-magnetic layer 13, and the free layer 14, wherein the non-magnetic layer 13 is sandwiched between the pinned layer 12 and the free layer 14. The pinned layer 12 is in contact with the first metal layer 11. The free layer 14 is in contact with the second metal layer 15. The pinned layer 12 and the free layer 14 may be made of ferromagnetic materials, while the non-magnetic layer 13 may be made of an insulating material. In the present embodiment, the non-magnetic layer 13 has a thickness of about 1.5 nm, and the free layer 14 has a thickness of about 20 nm. The pinned layer 12 has a fixed magnetization direction, and the free layer 14 has a freely changeable magnetization direction. The magnetization direction of the free layer 14 indicates stored data, which enables the free layer 14 to serve as a data storage layer. Accordingly, the MTJ cell is capable of storing binary digit data representing "0" and "1". If the magnetization directions of the pinned layer 12 and the free layer 14 are parallel to each other, then the MTJ cell is storing a first binary digit, for example, "0" If the magnetization directions of the pinned layer 12 and the free layer 14 are not parallel, then the MTJ cell is storing a second binary digit, for example, "1". The magnetization direction of the free layer 14 changes depending on an externally applied magnetic field.

As will be described later in greater detail, the first metal layer 11 and the second metal layer 15 extend in directions substantially perpendicular to each other. The MTJ cell is positioned at a crossing point between the first metal layer 11 and the second metal layer 15. As illustrated in FIG. 1B, a current 16 flows from the first metal layer 11 to the second metal layer 15 through the pinned layer 12, the non-magnetic layer 13, and the free layer 14. In the present example, the non-magnetic layer 13 comprises an insulating thin film, and the pinned layer 12 and free layer 14 comprise ferromagnetic thin films.

An electrical resistance of the non-magnetic layer 13 varies by about 10–40% due to the tunneling magnetoresistance effect between a first state where the magnetization directions of the pinned layer 12 and the free layer 14 are parallel to each other, and a second state where the magnetization directions of the pinned layer 12 and the free layer 14 are not parallel (FIG. 1C). A predetermined potential difference or a predetermined voltage may be given to the first and second metal layers 11 and 15 to apply a tunneling current from the pinned layer 12 through the non-magnetic layer 13 to the free layer 14. This tunneling current varies depending on the variable electrical resistance of the non-magnetic layer 13 due to the tunneling magnetoresistance effect. The data stored by the MJT cell may be retrieved by detecting the variation in the tunneling current.

Figure 2A:
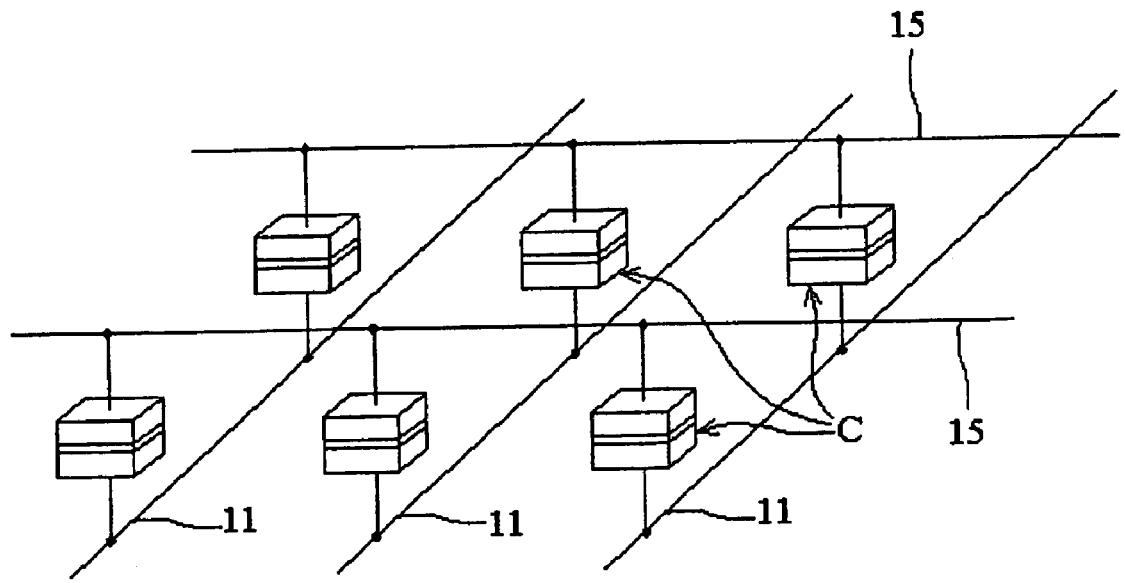
FIG. 2A is a fragmentary schematic perspective view illustrating an array of MTJ cells of the MRAM of FIG. 1A.
Figure 2B:
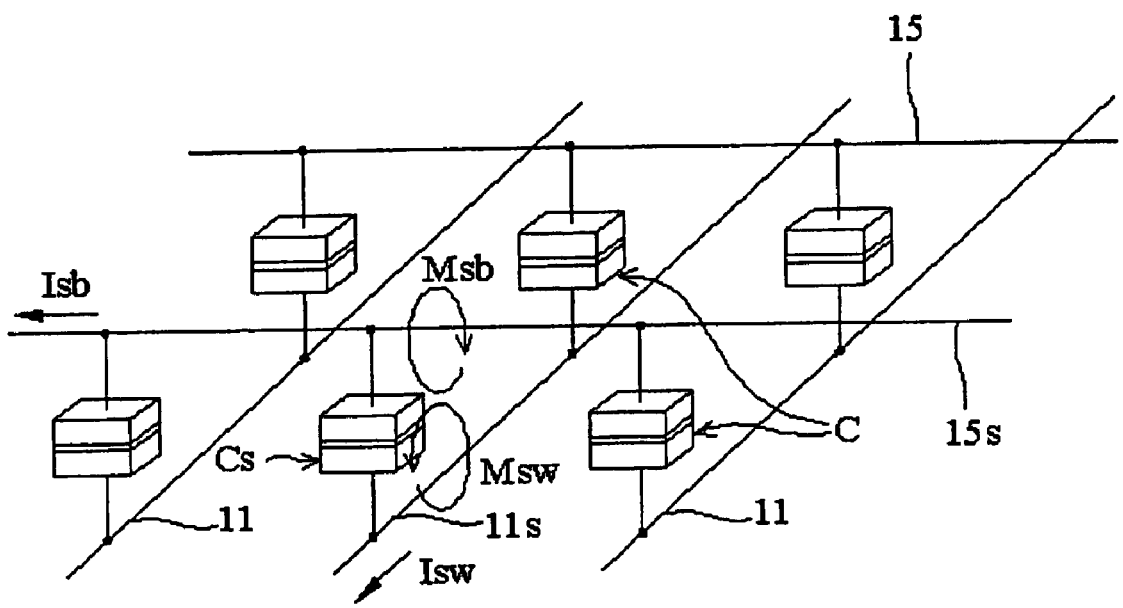
FIG. 2B is a fragmentary schematic perspective view illustrating the array of the MTJ cells during the write operation shown in FIG. 2A.

Referring to FIGS. 2A and 2B, the first metal layers 11 extend in parallel to each other in a first direction. The second metal layers 15 extend in parallel to each other in a second direction, which is substantially perpendicular to the first direction. The single first metal layer 11 and the single second metal layer 15 have a single crossing point, where a single MTJ cell "C" is positioned. The plural first metal layers 11 and the plural second metal layers 15 have an array of crossing points where plural MTJ cells "C" are provided. In the present example, the first metal layers 11 serve as word lines and the second metal layers 15 serve as bit lines. It is understood that the first and second metal layers 11, 15 may comprise any bus or conductive line. A particular one of the plural MTJ cells "C" may be selected for read or write operations by selecting the corresponding word line and bit line. The first and second metal layers 11, 15 may be used to perform read and write operations on the memory cells.

The write operation may be accomplished as follows. One of the word lines 11 and one of the bit lines 15 are selected. A first write current Isw is applied to the selected word line 11s. A first magnetic field Msw is generated around the selected word line 11s. The first write current Isw has a predetermined current value and a predetermined direction. A second write current Isb is applied to the selected bit line 15s. The second write current Isb has a predetermined current value and a predetermined direction. A second magnetic field Msb is generated around the selected bit line 15s. As a result, a superimposed magnetic field of both the first and second magnetic field Msw and Msb is applied to the crossing point of the selected word line 11s and the selected bit line 15s. The selected MTJ cell "Cs" is positioned at the crossing point of the selected word line 11s and the selected bit line 15s, for which reason the selected MTJ cell "Cs" is applied with the superimposed magnetic field. The free layer 14 of the selected MTJ cell "Cs" is also applied with the superimposed magnetic field, whereby magnetic domains of the free layer 14 become ordered in a first direction, for example, in a direction parallel to the magnetization direction of the pinned layer 12. As a result, the selected MTJ cell "Cs" stores a binary digit data "0".

If the first write current Isw or second write current Isb changes its current direction to an opposite direction, the direction of the magnetic field is inverted and the direction of the superimposed magnetic field is changed by approximately 90 degrees. As a result, the magnetic domains of the free layer 14 become ordered in a second direction, for example, in a direction anti-parallel to the magnetization direction of the pinned layer 12. As a result, the selected MTJ cell "Cs" stores a binary digit "1".

The read operation is accomplished as follows. One of the word lines 11 and one of the bit lines 15 are selected. A potential difference is applied between the selected word line 11s and the selected bit line 15s for measuring a current value to detect a resistance value of the selected memory cell "Cs" to the tunneling current. Namely, a predetermined potential difference or a predetermined voltage is applied to the selected word line 11s and the selected bit line 15s to provide a tunneling current from the pinned layer 12 through the insulating layer 13 to the free layer 14 of the selected memory cell "Cs". This tunneling current varies depending on the variable electrical resistance of the insulating layer 13 due to the tunneling magnetoresistance effect. The binary digit data can be detected from the selected memory cell "Cs" by detecting the variation in the tunneling current.

Figure 3:
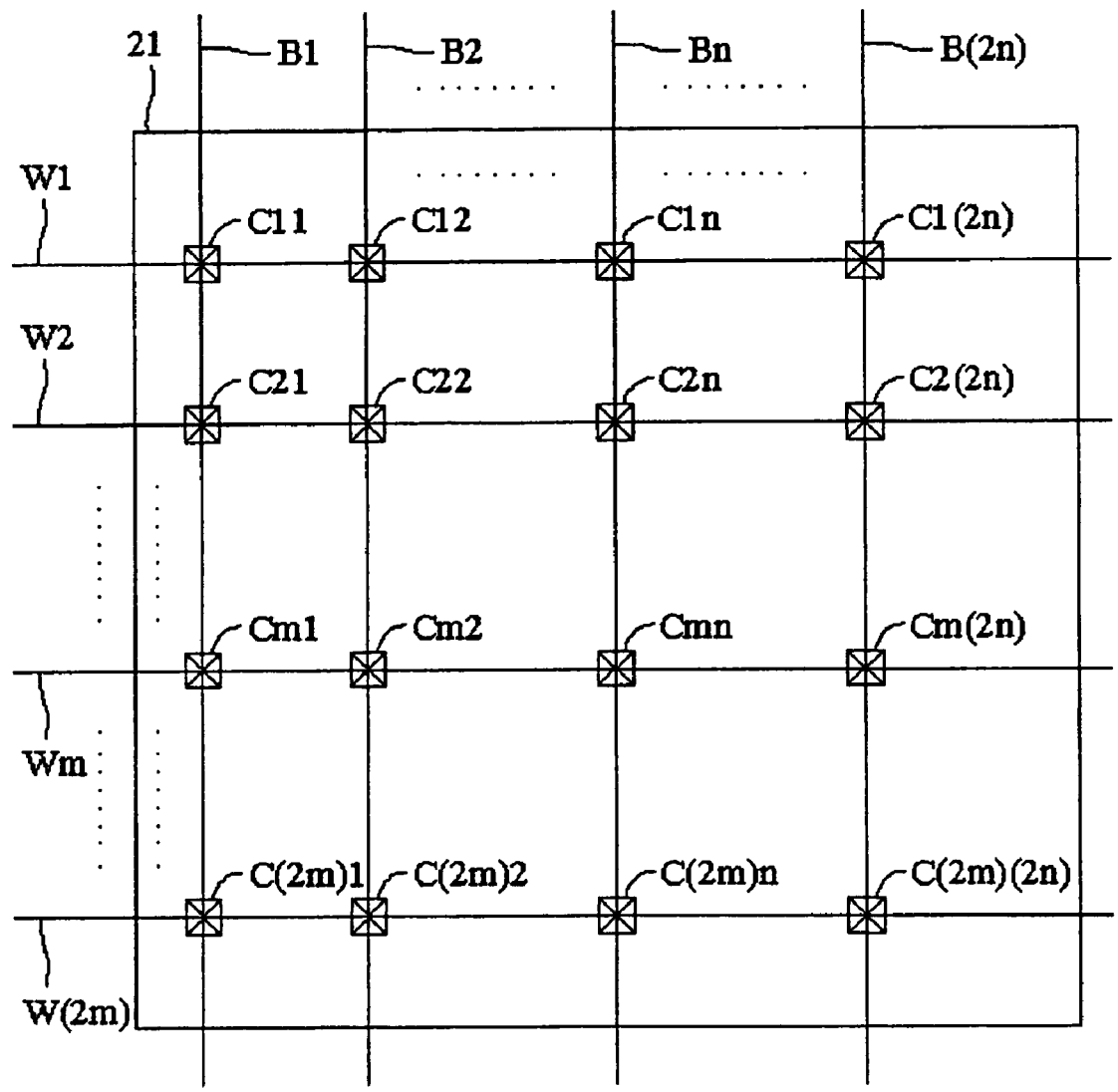
FIG. 3 is a diagram illustrating a conventional array structure of the MTJ cells in the MRAM.

Referring to FIG. 3, a typical array structure of MTJ cells in the MRAM is illustrated. An array 21 includes $2m$ word lines (W1, W2, W3, - - - Wm, Wm+1, - - - , W2m) and $2n$ bit lines (B1, B2, B3, - - - Bn, Bn+1, - - - , B2n) as well as $2m \times 2n$ MTJ cells (C11, C12, - - - , C2m2n) which are positioned at crossing points of the word and bit lines. A word line Wig and a bit line Bj are selected to select a MTJ cell Cij positioned at the crossing point between the selected word line Wi and the selected bit line Bj for read or write operation as described above.

Figure 4:
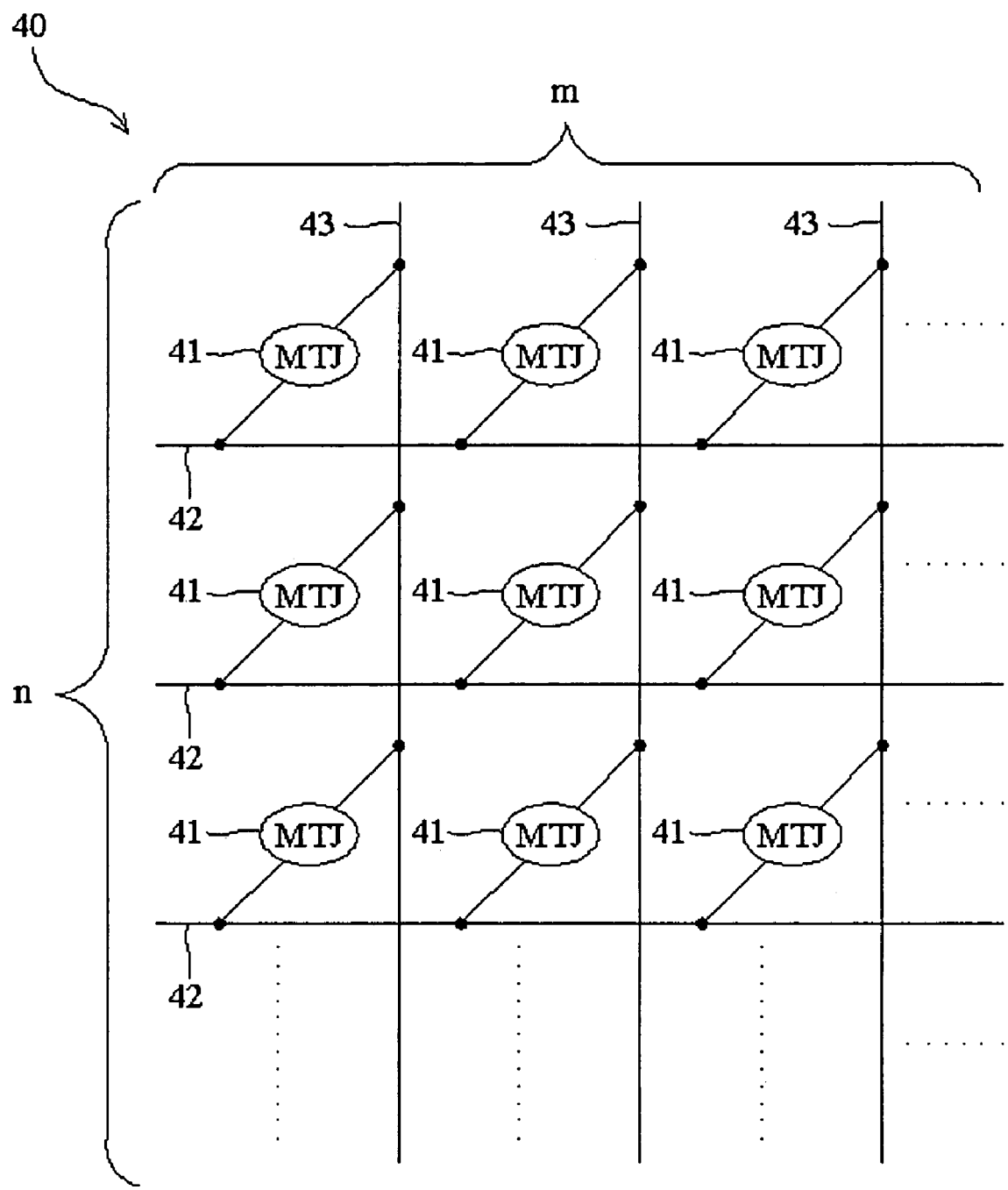
FIG. 4 depicts a cross point array having a plurality of MTJ memory cells.

Referring to FIG. 4, a cross point array 40 having a plurality of magnetic tunnel junction (MTJ) memory cells 41 is illustrated. The cross point array 40 includes "n" row lines 42 (also referred to as word lines) and "m" column lines 43 (also referred to as bit lines) that are substantially perpendicular to, and pass over (or under), the row lines 42. An MTJ memory cell 41 is located at an intersecting region of a row line 42 and a column line 43. The memory cell 41 is an MTJ connected in series between a row line 42 and a column line 43.

Figure 5A:
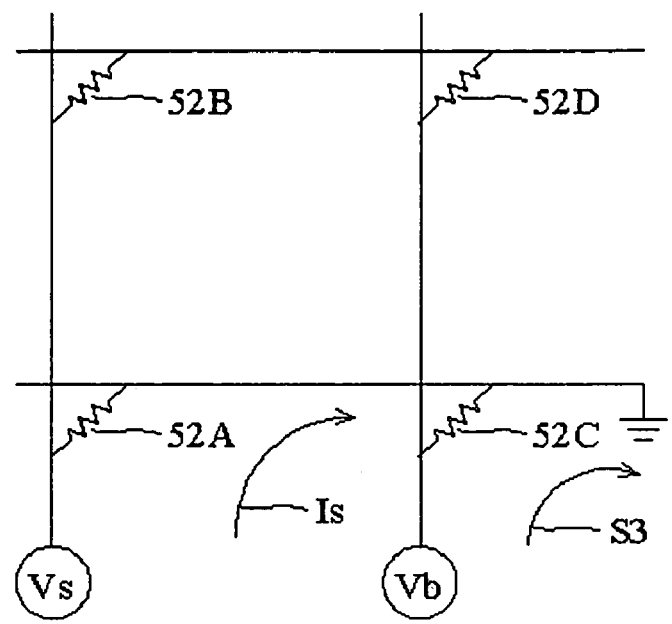
FIGS. 5A and 5B are illustrations of sense and sneak path currents flowing through an electrical equivalent of a resistive cross point array of the device shown in FIG. 4.
Figure 5B:
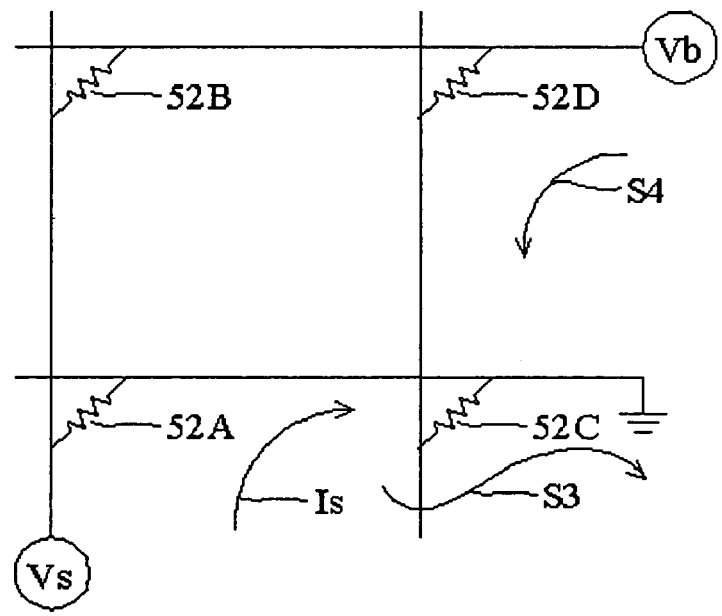

With additional reference to FIGS. 5A and 5B, sense and sneak path currents flowing through an electrical equivalent of a resistive cross point array of the device shown in FIG. 4 are illustrated. With particular reference to FIG. 5A, an electrical equivalent of the memory cell array of FIG. 4 is illustrated. A selected memory cell is represented by a first resistor 52A, and unselected memory cells are represented by second, third and fourth resistors 52B, 52C and 52D. The second resistor 52B represents the unselected memory cells along the selected bit line, the third resistor 52C represents the unselected memory cells along the selected word line, and the fourth resistor 52D represents the remaining unselected memory cells. If, for example, all of the memory cells 41 have a nominal resistance of about R and the array has n rows and m columns, then the second resistor 52B will have a resistance of about $R/(n-1)$, the third resistor 52C will have a resistance of about $R/(m-1)$, and the fourth resistor 52D will have a resistance of about $R/[(n-1)(m-1)]$.

The first resistor 52A may be selected by applying the array voltage (Vs) to the crossing bit line and a ground potential to the crossing word line. Consequently, a sense current (Is) flows through the first resistor 52A. However, the second, third and fourth resistors 52B, 52C and 52D are also coupled between the array voltage (Vs) and the ground potential.

To mitigate the effects of sneak path currents during read operations, the same operating potential Vb=Vs is applied to the unselected bit line. If Vb=Vs, sneak path currents are blocked from flowing through the second and fourth resistors 52B and 52D, and a sneak path current S3 flowing through the third resistor 52C will be directed to the ground potential and, therefore, will not interfere with the sense current (Is).

Alternatively, the effects of the sneak path currents may be mitigated by applying the same operating potential Vb=Vs to the unselected word line, as shown in FIG. 5B. A sneak path current is blocked from flowing through the second resistor 52B. Sneak path currents S3 and S4 flowing through the third and fourth resistors 52C and 52D are not directed to the ground potential and, therefore, will not interfere with the sense current (Is).

Accordingly, applying an equal potential to the unselected bit or word lines of the array 50 may eliminate or reduce obscuration of the sense current (Is). Consequently, the sense current (Is) and, therefore, the resistance state of the selected memory cell may be more reliably determined.

Figure 6:
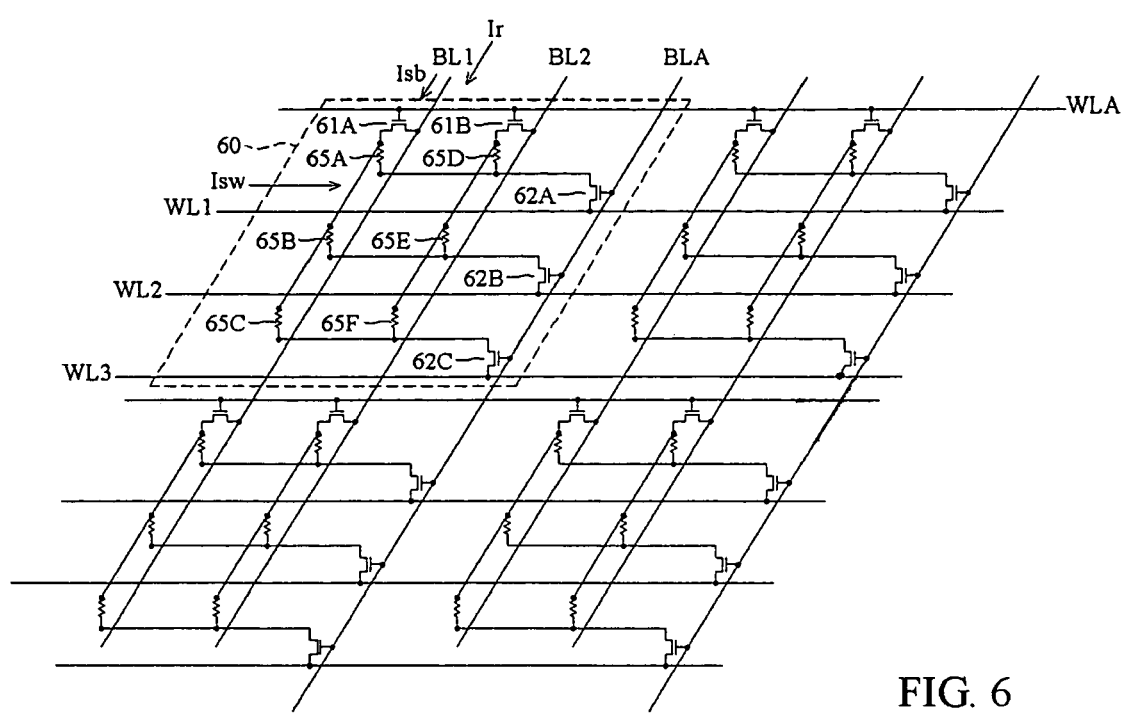
FIG. 6 is a schematic circuit illustrating one embodiment of a memory array of an MRAM device according to the present disclosure.

Referring now to FIG. 6, in one embodiment, an exemplary MRAM memory array for an MRAM device is illustrated. The MRAM memory array includes a plurality of segmented arrays. In the present example, each segmented array is a 3×2 array comprising a global bit line BLA and a global word line WLA extending in directions substantially perpendicular to each other. Each segmented array also comprises a plurality of bit lines BL1 and BL2 and word lines WL1–WL3, which are respectively parallel to the global bit line BLA and the global word line WLA. Here, the 3×2 array includes three word lines and two bit lines.

The current embodiment utilizes a plurality of negative-channel metal oxide semiconductor (NMOS) transistors 61A, 61B, and 62A–62C. The gates of NMOS transistors 61A and 61B are connected to the global word line WLA, and the first source/drains of the NMOS transistors 61A and 611B are respectively connected to the bit lines BL1 and BL2. The gates of the NMOS transistors 62A–62C are connected to the global bit line BLA, and the first source/drains of the NMOS transistors 62A–62C are respectively connected to the word lines WL1–WL3.

MTJ cells 65A–65F (represented by resistors) are positioned at crossing points between a word line and a bit line. More specifically, the MTJ cells 65A–65C positioned along the bit line BL1 are connected to the second source/drain of the NMOS transistor 61A, and the MTJ cells 65D–65F positioned along the bit line BL2 are connected to the second source/drain of the NMOS transistor 61B. The MTJ cells 65A and 65D positioned along the word line WL1 are connected to the second source/drain of the NMOS transistor 62A, the MTJ cells 65B and 65E positioned along the word line WL2 are connected to the second source/drain of the NMOS transistor 62B and the MTJ cells 65C and 65F positioned along the word line WL3 are connected to the second source/drain of the NMOS transistor 62C. Each MTJ cell 65A–65F comprises a pinned layer, a non-magnetic layer, and a free layer (such as are illustrated in FIG. 1A). As described previously with respect FIGS. 1A–1C, 2A, and 2B, current alteration may be used to read/write data associated with a particular MTJ cell.

To write data to the MTJ 65A, the word line WL1 and the bit line BL1 are selected. Thus, a first write current Isw is applied to the selected word line WL1. A first magnetic field is generated around the selected word line WL1. The first write current Isw has a predetermined current value and a predetermined direction. A second write current Isb is applied to the selected bit line BL1. The second write current Isb has a predetermined current value and a predetermined direction. A second magnetic field is generated around the selected bit line BL1. As a result, a superimposed magnetic field of both the first and second magnetic field generated by the current Isw and Isb is applied to the crossing point of the selected word line WL1 and the selected bit line BL1. The selected MTJ cell 65A is positioned at the crossing point of the selected word line WL1 and the selected bit line BL1, and the superimposed magnetic field is applied to the selected MTJ cell 65A. The superimposed magnetic field is also applied to the free layer of the selected MTJ cell 65A, whereby magnetic domains of the free layer become ordered in a first direction, for example, in a direction parallel to the magnetization direction of the pinned layer. As a result, the selected MTJ cell 65A stores binary digit data.

To read the MTJ 65A, the global word line WLA and the global bit line are selected and the word line WL1 is grounded. A read current Ir is then forced to the bit line BL1 and flows through the turned on NMOS transistor 61A, the selected MTJ 65A, the NMOS transistor 62A and the grounded word line WL1. Finally, the data stored in the selected MTJ cell is obtained by sensing the voltage level of the bit line BL1.

At this time, the NMOS transistors 61A, 61B and 62A–62C are all turned on, and sneak currents flow in the segmented array 60 because of the multi-path parallel resistance. However, the voltage level of the bit line BL1 is distinguished by the different data stored in the MTJ 65A, as is described below. As described above with respect to FIG. 5A, the selected MTJ cell 65A is represented by a first resistor 52A, and unselected memory cells are represented by second, third and fourth resistors 52B, 52C and 52D. The second resistor 52B represents the unselected memory cells along the selected bit line BL1, the third resistor 52C represents the unselected memory cells along the selected word line WL1, and the fourth resistor 52D represents the remaining unselected memory cells. In the present embodiment, the segmented MRAM array has three rows and two columns, and the MR ratio of MTJ cell is, for example, 40%. Accordingly, there are two resistance states: a low state of 1×ohm and a high state of 1.4×ohm. With additional reference to FIG. 7, a table illustrates exemplary impedance calculations for the array of FIG. 6. As shown in FIG. 7, when the resistance of the target MTJ cell and other MTJ cells are all approximately $1 \times \Omega$, the total resistance of the segmented MRAM array is approximately $0.667 \times \Omega$. Moreover, when the resistance of the target MTJ cell is approximately $1 \times \Omega$ and the resistances of the other MTJ cells are all approximately $1.4 \times \Omega$, the total resistance of the segmented MRAM array is approximately $0.7368 \times \Omega$. Thus, the total resistance of the segmented MRAM array is between approximately $0.667 \times \Omega$ and approximately $0.7368 \times \Omega$ when the resistance of the target MTJ cell is approximately $1 \times \Omega$. In addition, when the resistance of the target MTJ cell and the other MTJ cells are all approximately $1.4 \times \Omega$, the total resistance of the segmented MRAM array is approximately $0.9333 \times \Omega$. In addition, when the resistance of the target MTJ cell is approximately $1.4 \times \Omega$ and the resistances of the other MTJ cells are all approximately $1 \times \Omega$, the total resistance of the segmented MRAM array is approximately 0.8235×Ω. Thus, the total resistance of the segmented MRAM array is between approximately 0.8235×Ω and approximately 0.9333×Ω when the resistance of the target MTJ cell is approximately 1.4×Ω. Therefore, the resistance difference ratio of segmented MRAM array between the highest total resistance while the resistance of the target MTJ cell is approximately 1×Ω and the lowest total resistance while the resistance of the target MTJ cell is approximately 1.4×Ω is 11.8%, which is determined by the sensing circuit. Thus, the data stored in the target MTJ cell may be obtained by a single reading step.

With additional reference to FIG. 8, if the segmented memory array is a 3×3 array, then the data stored in the target MTJ cell may also be obtained by a single reading step. More specifically, as shown in FIG. 8 (which illustrates exemplary impedance calculations for a 3×3 array), when the resistance of the target MTJ cell and the other MTJ cells are all approximately 1×Ω, the total resistance of the segmented MRAM array is approximately 0.5556×Ω. In addition, when the resistance of the target MTJ cell is approximately 1×Ω and the resistances of the other MTJ cells are all approximately 1.4×Ω, the total resistance of the segmented MRAM array is approximately 0.6364×Ω. Thus, the total resistance of the segmented MRAM array is between approximately 0.5556×Ω and approximately 0.6364×Ω when the resistance of the target MTJ cell is approximately 1×Ω. In addition, when the resistance of the target MTJ cell and the other MTJ cells are all approximately 1.4×Ω, the total resistance of the segmented MRAM array is approximately 0.7778×Ω. In addition, when the resistance of the target MTJ cell is approximately 1.4×Ω and the resistances of the other MTJ cells are all approximately 1×Ω, the total resistance of the segmented MRAM array is approximately 0.6604×Ω. Thus, the total resistance of the segmented MRAM array is between approximately 0.6604×Ω and approximately 0.7778×Ω when the resistance of the target MTJ cell is approximately 1.4×Ω. Therefore, the resistance difference ratio of the segmented MRAM array between the highest total resistance when the resistance of the target MTJ cell is approximately 1×Ω and the lowest total resistance when the resistance of the target MTJ cell is approximately 1.4×Ω is approximately 3.8%, which is also differentiable by the sensing circuit. Accordingly, the data stored in the target MTJ cell may be obtained by a single reading step.

Figure 9:
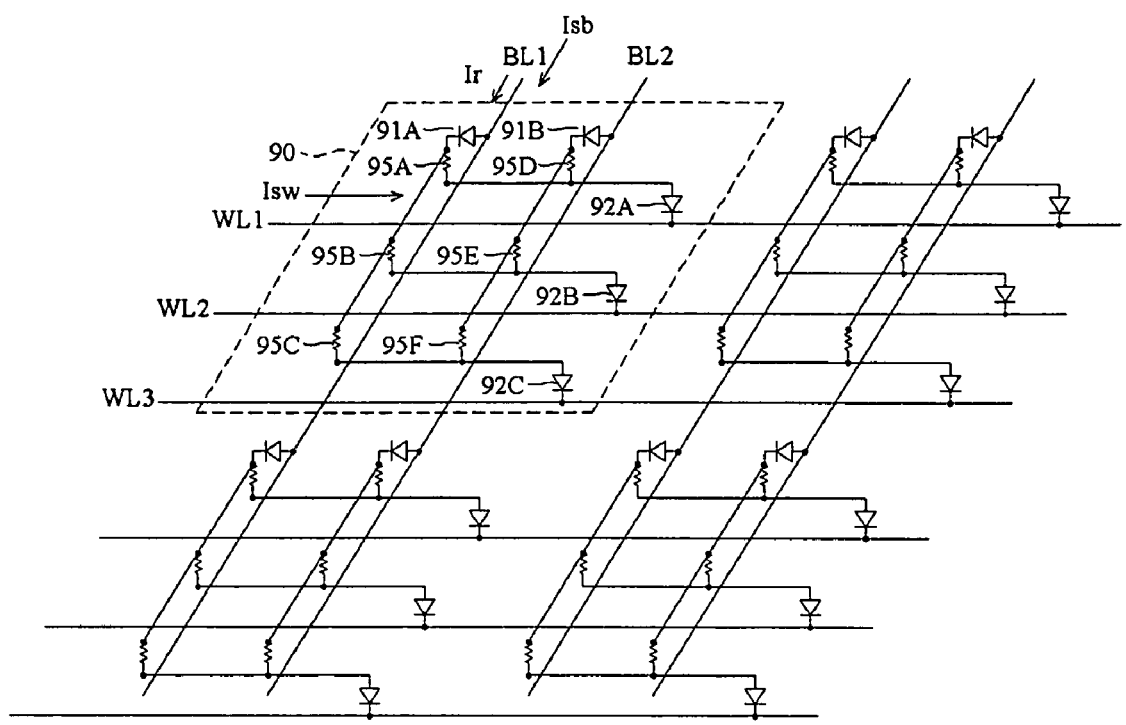
FIG. 9 is a schematic circuit illustrating another embodiment of a memory array of an MRAM device according to the present disclosure.

Referring now to FIG. 9, in another embodiment, a schematic circuit illustrative of another exemplary memory array for a MRAM device is illustrated. The MRAM memory array includes a plurality of segmented arrays. The segmented array in the present example comprises a plurality of bit lines BL1 and BL2, and a plurality of word line WL1–WL3 that extend in directions substantially perpendicular to each other. Here, the 3×2 array includes three word lines and two bit lines. One side of the diodes 91A and 91B are respectively connected to the bit lines BL1 and BL2. In addition, the other side of the diodes 92A–92C are respectively connected to the word lines WL1–WL3.

MTJ cells 95A–95F are positioned at crossing points between a word line and a bit line. The MTJ cells 95A–95C positioned along the bit line BL1 are connected to the cathode of the diode 91A, and the MTJ cells 95D–965F positioned along the bit line BL2 are connected to the anode of the diode 91B. In addition, the MTJ cells 95A and 95D positioned along the word line WL1 are connected to the anode of the diode 92A, the MTJ cells 95B and 95E positioned along the word line WL2 are connected to the anode of the diode 92B and the MTJ cells 95C and 95F positioned along the word line WL3 are connected to the anode of the diode 92C. The MTJ cells 95A–95F comprise a pinned layer, a non-magnetic layer, and a free layer (such as are illustrated in FIG. 1A). As described previously with respect FIGS. 1A–1C, 2A, and 2B, current alteration may be used to read/write data associated with a particular MTJ cell.

To write data to the MTJ 95A, the word line WL1 and the bit line BL1 are selected. Thus, a first write current Isw is applied to the selected word line WL1. A first magnetic field is generated around the selected word line WL1. The first write current Isw has a predetermined current value and a predetermined direction. A second write current Isb is applied to the selected bit line BL1. The second write current Isb has a predetermined current value and a predetermined direction. A second magnetic field is generated around the selected bit line BL1. As a result, a superimposed magnetic field of both the first and second magnetic field generated by the currents Isw and Isb is applied to the crossing point of the selected word line WL1 and the selected bit line BL1. The selected MTJ cell 95A is positioned at the crossing point of the selected word line WL1 and the selected bit line BL1, and for this reason the superimposed magnetic field is applied to the selected MTJ cell 95A. The superimposed magnetic field is also applied to the free layer of the selected MTJ cell 95A, whereby magnetic domains of the free layer become ordered in a first direction, for example, in a direction parallel to the magnetization direction of the pinned layer. As a result, the selected MTJ cell 95A stores a binary digit data.

To read the MTJ 95A, the word line WL1 is grounded and the other word lines WL2 and WL3 are subjected to a predetermined voltage, such as Vcc. A read current Ir is then forced to the bit line BL1 and flows through the diode 91A, the selected MTJ 95A, the diode 92A, and the grounded word line WL1. Finally, the data stored in the selected MTJ cell is obtained by sensing the voltage level of the bit line BL1.

At this time, the sneak currents flow in the segmented array 90 because of the multi-path parallel resistance. However, the voltage level of the bit line BL1 is distinguished between the different data stored in the MTJ 95A as is described in the first embodiment. Accordingly, using the exemplary tables of FIG. 7 and FIG. 8, the data stored in the target MTJ cell may be obtained by a single reading step.

According to the previously described embodiments, in the case of a 3×2 cross point array, the status of a target MTJ cell is determinable even if there is sneak current. In the present example, the minimum signal ratio is around 11.8%, providing the MR ratio of the MTJ cell at approximately 40%. The minimum signal ratio may be around 3.8% in the case of 3×3 cross point array.

In addition, according to the previously described embodiments, either FETs or diodes may be used to separate each segment array and confine the sneak current. As in the first embodiment, there are 6 bits sharing 5 FETs in the unit segment. This enables a relatively high element density to be achieved. For a unit segment with a 3×3 array, higher element density may also be achieved over the conventional ground. Moreover, if the MR ratio of the MTJ cell is increased or the precision of the voltage-sensing device is improved, the array size of the cross point array may extend to achieve higher element density.

Although illustrative embodiments have been shown and described, a wide range of modifications, changes, and substitutions are contemplated. It is understood that modifications, changes and substitutions are intended in the foregoing disclosure and in some instances some features of the disclosure may be employed without a corresponding use of other features. Furthermore, it is understood that variations may be made in the foregoing embodiments without departing from the scope of the disclosure. For example, it is understood that different sizes and/or configurations of arrays may be used. Furthermore, although exemplary circuit configurations are illustrated, it is understood that the same functionality may be achieved using other circuit configurations. Accordingly, it is appropriate that the appended claims be construed broadly and in a manner consistent with the scope of the disclosure.

What is claimed is:

1. An MRAM memory array, comprising:
   word lines;
   bit lines crossing the word lines;
   first diodes, each first diode comprising:
      a cathode; and
      an anode coupled to a corresponding bit line;
   second diodes, each second diode comprising:
      an anode; and
      a cathode coupled to a corresponding word line; and
   magnetic tunnel junction memories including:
      a pinned layer;
      a free layer; and
      a non-magnetic layer located between the pinned layer and the free layer;
   each magnetic tunnel junction memory being positioned at a crossing point of a bit line and a word line, each magnetic tunnel junction memory being connected between a first diode at a corresponding crossing bit line and a second diode at a corresponding crossing word line.

2. The MRAM memory array as claimed in claim 1, wherein the number of diodes is equal to the total number of word lines and bit lines.

3. The MRAM memory array as claimed in claim 1, wherein the number of magnetic tunnel junction memories is the product of the number of word lines and the number of bit lines.

4. The MRAM memory array as claimed in claim 1, wherein the numbers of word lines is three and the numbers of the bit lines is two.

5. The MRAM memory array as claimed in claim 1, wherein the numbers of word lines is three and the number of bit lines is three.

6. An MRAM memory array, comprising:
   a first word line;
   a second word line;
   a third word line;
   a first bit line crossing the first word line, the first bit line further crossing the second word line; the first bit line further crossing the third word line;
   a second bit line crossing the first word line, the second bit line further crossing the second word line; the second bit line further crossing the third word line;
   a first diode having a first cathode, and a first anode coupled to the first bit line;
   a second diode having a second cathode, and a second anode coupled to the second bit line;
   a third diode having a third anode, and a third cathode coupled to the first word line;
   a fourth diode having a fourth anode, and a fourth cathode coupled to the second word line;
   a fifth diode having a fifth anode, and a fifth cathode coupled to the third word line;
   a first magnetic tunnel junction memory connected between the first cathode and the third anode, the first magnetic tunnel junction memory including:
      a first pinned layer;
      a first free layer; and
      a first non-magnetic layer located between the first pinned layer and the first free layer;
   the first magnetic tunnel junction memory being positioned at a crossing point of the first bit line arid the first word line;
   a second magnetic tunnel junction memory connected between the second cathode and the third anode, the second magnetic tunnel junction memory including:
      a second pinned layer;
      a second free layer; and
      a second non-magnetic layer located between the second pinned layer and the second free layer;
   the second magnetic tunnel junction memory being positioned at crossing point of the second bit line and the first word line;
   a third magnetic tunnel junction memory connected between the first cathode and the fourth anode, the third magnetic tunnel junction memory including:
      a third pinned layer;
      a third free layer; and
      a third non-magnetic layer located between the third pinned layer and the third free layer;
   the third magnetic tunnel junction memory being positioned at crossing point of the first bit line and the second word line;
   a fourth magnetic tunnel junction memory connected between the second cathode and the fourth anode, the fourth magnetic tunnel junction memory including:
      a fourth pinned layer;
      a fourth free layer; and
      a fourth non-magnetic layer located between the fourth pinned layer and the fourth free layer;
   the fourth magnetic tunnel junction memory being positioned at crossing point of the second bit line and the second word line;
   a fifth magnetic tunnel junction memory connected between the first cathode and the fifth anode, the fifth magnetic tunnel junction memory including:
      a fifth pinned layer;
      a fifth free layer; and
      a fifth non-magnetic layer located between the fifth pinned layer and the fifth free layer;
   the fifth magnetic tunnel junction memory being positioned at crossing point of the first bit line and the third word line; and
   a sixth magnetic tunnel junction memory connected between the second cathode and the fifth anode, the sixth magnetic tunnel junction memory including:
      a sixth pinned layer;
      a sixth free layer; and
      a sixth non-magnetic layer located between the sixth pinned layer and the sixth free layer;
   the sixth magnetic tunnel junction memory being positioned at crossing point of the second bit line and the third word line.

7. An MRAM memory array comprising:
   a plurality of word and bit lines;
   a plurality of first and second diodes, wherein each of the first diodes comprising a cathode and an anode that couples to a corresponding bit line and each of the second diodes comprising an anode and a cathode that couples to a corresponding word line; and a plurality of magnetic tunnel junction memories each positioned where one of the first conductive lines crosses one of the second conductive lines, wherein each of the plurality of magnetic tunnel junction memories is connected between a first diode at the corresponding bit line and a second diode at the corresponding word line.

8. The MRAM memory array of claim 7 wherein each magnetic tunnel junction memories includes a pinned layer, a free layer, and a non-magnetic layer located between the pinned layer and the free layer.

9. The MRAM memory array of claim 7 wherein a total number of first and second diodes is equal to a total number of word and bit lines.

10. The MRAM memory array of claim 7 wherein a total number of the magnetic tunnel junction memories is a product of a total number of word lines and a total number of the bit lines.

11. The MRAM memory array of claim 7 further comprising a plurality of segments, wherein each segment includes at least two of the plurality of magnetic tunnel junction memories.

12. The MRAM memory array of claim 11 wherein the segments are separated by diodes.

* * * * *